US010041155B2

(12) United States Patent
Takahata

(10) Patent No.: US 10,041,155 B2
(45) Date of Patent: Aug. 7, 2018

(54) HIGH-PURITY YTTRIUM, PROCESS OF PRODUCING HIGH-PURITY YTTRIUM, HIGH-PURITY YTTRIUM SPUTTERING TARGET, METAL GATE FILM DEPOSITED WITH HIGH-PURITY YTTRIUM SPUTTERING TARGET, AND SEMICONDUCTOR ELEMENT AND DEVICE EQUIPPED WITH THE METAL GATE FILM

(75) Inventor: Masahiro Takahata, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 498 days.

(21) Appl. No.: 14/130,523

(22) PCT Filed: Sep. 15, 2011

(86) PCT No.: PCT/JP2011/071131
§ 371 (c)(1),
(2), (4) Date: Jan. 2, 2014

(87) PCT Pub. No.: WO2013/005349
PCT Pub. Date: Jan. 10, 2013

(65) Prior Publication Data
US 2014/0140884 A1 May 22, 2014

(30) Foreign Application Priority Data
Jul. 6, 2011 (JP) .................................. 2011-150067

(51) Int. Cl.
C22C 28/00 (2006.01)
C22B 59/00 (2006.01)
(Continued)

(52) U.S. Cl.
CPC .............. *C22C 28/00* (2013.01); *C22B 59/00* (2013.01); *C23C 14/3414* (2013.01); *C25C 3/34* (2013.01)

(58) Field of Classification Search
CPC .... H01L 21/02192; C22B 59/00; C22C 28/00
See application file for complete search history.

(56) References Cited

U.S. PATENT DOCUMENTS 8,668,785 B2 3/2014 Shindo et al.
2009/0090621 A1 4/2009 Tsukamoto
(Continued)

FOREIGN PATENT DOCUMENTS

JP 04-176886 A 6/1992
JP 04-176887 A 6/1992
(Continued)

OTHER PUBLICATIONS

Eisuke Tokumitsu et al., "A Study on High-Dielectric Constant Oxide Materials for MOSFET Gate Insulator Applications", The Institute of Electrical Engineers of Japan, Research Paper of Electronic Materials, vol. 6-13, pp. 37-41, Sep. 2001.
(Continued)

Primary Examiner — Weiping Zhu
(74) Attorney, Agent, or Firm — Howson & Howson LLP

(57) ABSTRACT

Provided are high-purity yttrium and a high-purity yttrium sputtering target each having a purity, excluding rare earth elements and gas components, of 5 N or more and containing 1 wt ppm or less of each of Al, Fe, and Cu; a method of producing high-purity yttrium by molten salt electrolysis of a raw material being a crude yttrium oxide having a purity, excluding gas components, of 4N or less at a bath temperature of 500° C. to 800° C. to obtain yttrium crystals, desalting treatment, water washing, and drying of the yttrium crystals, and then electron beam melting for removing volatile materials to achieve a purity, excluding rare earth elements and gas components, of 5N or more; and a technology capable of efficiently and stably providing high-purity yttrium, a sputtering target composed of the high-
(Continued)

purity yttrium, and a metal-gate thin film mainly composed of the high-purity yttrium.

20 Claims, 1 Drawing Sheet

(51) Int. Cl.
*C25C 3/34* (2006.01)
*C23C 14/34* (2006.01)

(56) References Cited

U.S. PATENT DOCUMENTS

| 2010/0044223 A1 | 2/2010 | Tsukamoto |
| 2011/0300017 A1 | 12/2011 | Shindo et al. |
| 2014/0124366 A1 | 5/2014 | Takahata |

FOREIGN PATENT DOCUMENTS

| JP | 04-176888 A | | 6/1992 |
| JP | 04-176889 A | | 6/1992 |
| JP | 04176889 A | * | 6/1992 |
| JP | 05-017134 A | | 1/1993 |
| JP | 06-122931 A | | 5/1994 |
| JP | 06-280081 A | | 10/1994 |
| JP | 07-090411 A | | 4/1995 |
| JP | 07-126834 A | | 5/1995 |
| JP | 10-287402 A | | 10/1998 |
| JP | 2004-036003 A | | 2/2004 |
| JP | 2007-073749 A | | 3/2007 |

OTHER PUBLICATIONS

Kentaro Shima, "Process of High-Purity Metals and Physical Property", Kabushiki Kaisha CMC, pp. 8-9 and 124-129, Dec. 2000.

Yuichiro Shindo et al., "Production of High-Purity Yttrium by Molten Salt Electrolytic Method", The Mining and Materials Processing Institute of Japan, p. 46-47, 1992 (month unknown).

V.T. Volkov et al., "Ultrapurification of Yttrium Metal from Oxide to Single Crystal: Results and Perspectives", Vacuum, vol. 53, pp. 105-108, 1999 (month unknown).

C.K. Gupta et al., "Extractive Metallurgy of Rare Earths", International Materials Reviews, vol. 37, No. 5, pp. 197-248, 1992 (month unknown).

* cited by examiner

[Fig. 1]
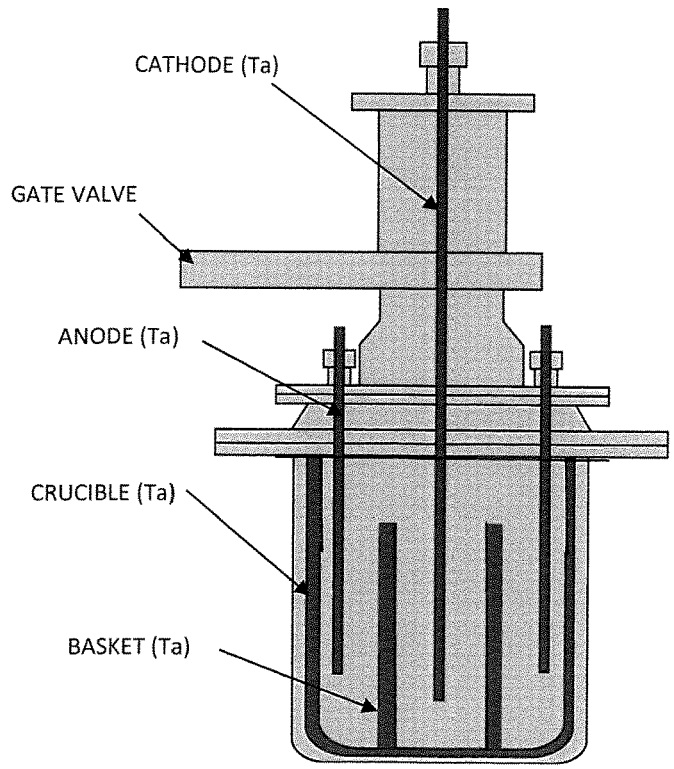
[Fig. 2]
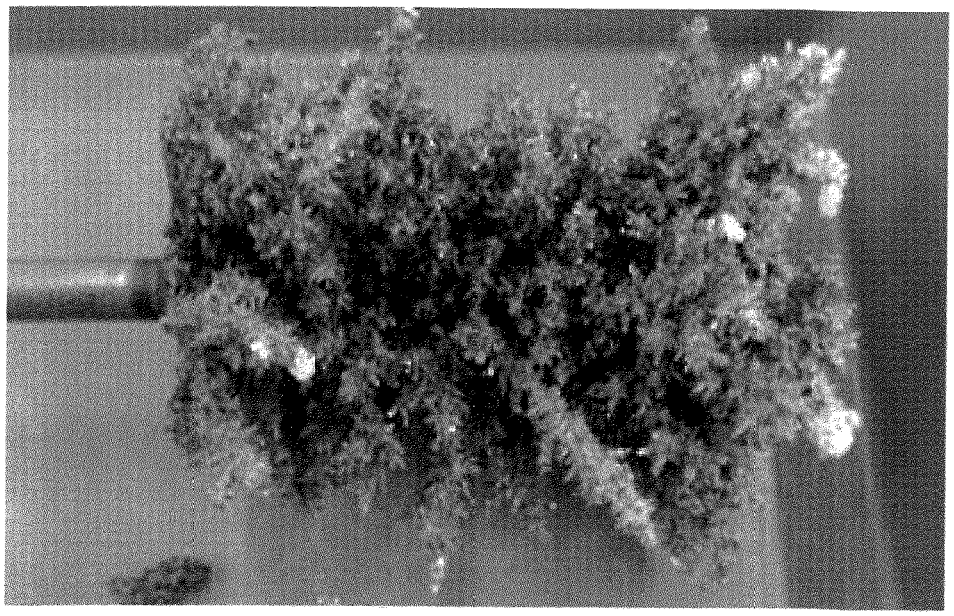

HIGH-PURITY YTTRIUM, PROCESS OF PRODUCING HIGH-PURITY YTTRIUM, HIGH-PURITY YTTRIUM SPUTTERING TARGET, METAL GATE FILM DEPOSITED WITH HIGH-PURITY YTTRIUM SPUTTERING TARGET, AND SEMICONDUCTOR ELEMENT AND DEVICE EQUIPPED WITH THE METAL GATE FILM

BACKGROUND

The present invention relates to high-purity yttrium, a method of producing the high-purity yttrium, a sputtering target produced using the high-purity yttrium, a metal gate film mainly composed of the high-purity yttrium, and a semiconductor element and a device each comprising the metal gate film.

Yttrium (Y) is a rare earth element. Yttrium is an ash black metal having an atomic number of 39 and an atomic weight of 88.91 and has a hexagonal close-packed structure, a melting point of 1520° C., a boiling point of 3300° C., and a density of 4.47 g/cm$^3$. Yttrium is readily oxidized on the surface in the air, is soluble in acid, but insoluble in alkali, and reacts with hot water. Its ductility and extensibility are low (see Dictionary of Physics and Chemistry).

Rare earth elements having an oxidation number of 3 are generally stable, and yttrium is trivalent. Recently, yttrium has been researched and developed as an electronic material such as a metal gate material or a high-dielectric constant (high-k) material and is a metal attracting a lot of attention.

An yttrium metal has a problem of being easily oxidized during purification and is therefore a material of which high-purification is difficult and there was not a high-purity product. An yttrium metal that has been left to stand in the air is oxidized within a short period of time into $Y_2O_3$ and changes the color into black.

Recently, there is a demand for reducing the thicknesses of gate insulating films of next-generation MOSFETs, but in $SiO_2$, which has been used for gate insulating films, the leak current due to a tunnel effect increases with a reduction in thickness, resulting in a difficulty in normal operation.

Accordingly, as alternatives thereto, $HfO_2$, $ZrO_2$, $Al_2O_3$, and $La_2O_3$ have been proposed as materials having high dielectric constants, high thermal stability, and high energy barriers to holes and electrons in silicon. In these materials, in particular, $La_2O_3$ is highly rated and has been investigated for its electrical characteristics, and studies on $La_2O_3$ as a material for gate insulating films in next-generation MOSFETs have been reported (see Non-Patent Document 1). However, the study in this Non-Patent Document relates to $La_2O_3$ films and does not particularly mention the characteristics and behaviors of an yttrium (Y) element itself.

Thus, lanthanum is a material that is gathering attention in a tendency of recent technologies, but yttrium, which is a metal having similar physical properties as a rare earth metal, has almost not been studied for its use as an electronic part material. It is easily supposed that if yttrium is used in such an electronic part (e.g., a gate insulating film of next-generation MOSFET), the presence of other impurities is undesirable for taking advantage of the characteristics of yttrium itself as a metal having physical properties as a rare earth metal, and an increase in purity is necessary.

Thus, yttrium (yttrium oxide) is still in the research phase. In investigation of the characteristics of yttrium (yttrium oxide), if an yttrium metal itself is present as a sputtering target material, the sputtering target has such considerable advantages that: a thin film of yttrium can be formed on a substrate; the behaviors of the interface with a silicon substrate can be readily investigated; the characteristics of, for example, a gate insulating film having a high dielectric constant can be readily investigated by forming an yttrium compound; and also the degree of freedom as a product increases.

In formation of a film by sputtering with a target of yttrium, occurrence of a protrusion (nodule) on a target surface is a problem. The protrusion induces abnormal discharge to cause generation of particles by, for example, rupture of the protrusion (nodule).

The generation of particles causes increases in failure rates of metal gate films and semiconductor elements and devices. Accordingly, in order to utilize the characteristics of yttrium, reductions in contents of, in particular, Al, Fe, and Cu are required. In addition, carbon (graphite) contained in yttrium is present as a solid and is difficult to be detected because of it conductivity. The amount of carbon is therefore required to be reduced.

Furthermore, yttrium is a material of which high purification is difficult, but in order to utilize the characteristics of yttrium, in addition to Al, Fe, Cu, and carbon (graphite), the amounts of materials that affect the characteristics of semiconductors, such as alkaline metals, alkali earth metals, transition metal elements, high-melting-point metal elements, and radioactive elements, are required to be reduced. Accordingly, yttrium is desired to have a purity of 5N or more.

Furthermore, there is a problem that removal of lanthanoids other than yttrium is significantly difficult. Fortunately, since lanthanoids other than yttrium have similar properties, slight contamination thereof does not cause any problem. In addition, slight contamination of gas components does not cause a big problem. Removal of gas components is usually difficult, and purities are generally shown as those excluding gas components.

Conventionally, the problems related to characteristics of yttrium, how to produce high-purity yttrium, and behaviors of impurities contained in an yttrium target have not sufficiently investigated. Accordingly, it is desired to immediately solve the problems mentioned above.

In publicly known documents, Patent Document 1 describes a molten salt electrolysis apparatus that can be installed to a vacuum distillation apparatus as an apparatus for producing high-purity yttrium. In this case, however, it is unclear how highly purified yttrium can be produced.

Patent Document 2 discloses, as a method of producing high-purity yttrium, a method in which machinery arrangement of a molten salt electrolysis apparatus and a vacuum distillation apparatus has been devised, and proposes subjecting the high-purity yttrium to electron beam melting thereafter. In addition, an example of reducing each concentration of Fe, Cr, Ni, U, and Th as impurities of interest to less than 1 ppm is shown. However, it is not clearly described how much the impurities can be reduced in each step, what becomes of other impurities, and how much high purity is eventually achieved.

Patent Document 3 describes a molten salt electrolysis apparatus in which the structure of a crucible has been devised for a method of producing high-purity yttrium. In addition, an example of yttrium in which each concentration of Fe, Cr, Ni, Cu, U, and Th as impurities of interest is reduced to less than 1 ppm is shown. However, it is unclear how highly purified yttrium can be produced and how impurities other than the above are removed from yttrium.

Patent Document 4 describes a molten salt electrolysis apparatus in which the structures of an anode and a crucible have been devised for a method of producing high-purity yttrium. In addition, an example of yttrium in which each concentration of Fe, Cr, Ni, Cu, U, and Th as impurities of interest is reduced to less than 1 ppm is shown. However, it is unclear how highly purified yttrium can be produced and how impurities other than the above are removed from yttrium.

Patent Document 5 describes a vacuum distillation apparatus for yttrium chloride anhydrous in which the arrangement structure of a distillation container and a condenser is devised for a method of producing high-purity yttrium. In addition, an example of yttrium in which each concentration of Fe, Cr, Ni, Cu, Mg, and Mn as impurities of interest is reduced to less than 1 ppm is shown. However, it is unclear how highly purified yttrium can be eventually produced and how impurities other than the above are removed from yttrium.

Patent Document 6 describes use of an amorphous film of yttrium for forming a YAG thin film that is used as a solid laser oscillation material. High-purity yttrium is probably used, but the purity of this yttrium and the technology for producing this high-purity yttrium are not disclosed.

Patent Document 7 describes a solvent extraction process as a method of separating high-purity yttrium. It is described that the resulting purity of a Y compound relative to all rare earth compounds reaches 99.0% to 99.996% (wt %). However, it is not clearly described what becomes of other impurities such as transition metals and how much high purity is achieved on the whole.

Patent Document 1: Japanese Patent Laid-Open No. H04-176886
Patent Document 2: Japanese Patent Laid-Open No. H04-176887
Patent Document 3: Japanese Patent Laid-Open No. H04-176888
Patent Document 4: Japanese Patent Laid-Open No. H04-176889
Patent Document 5: Japanese Patent Laid-Open No. H05-17134
Patent Document 6: Japanese Patent Laid-Open No. H07-126834
Patent Document 7: Japanese Patent Laid-Open No. 2004-36003
Non-Patent Document 1: Eisuke Tokumitsu and two others, "Study of oxide materials for high-k gate insulating film", Denki Gakkai Denshi Zairyo Kenkyukai Shiryo, Vol. 6-13, pp. 37-41, published on 21 Sep. 2001

SUMMARY OF INVENTION

It is an object of the present invention to provide a method of producing high-purity yttrium, high-purity yttrium, a sputtering target produced using the high-purity yttrium, a metal gate film formed using the sputtering target, and a technology capable of stably providing a semiconductor element and a device each comprising the metal gate film.

The present invention provides high-purity yttrium and a high-purity yttrium sputtering target each having a purity, excluding rare earth elements and gas components, of 5N or more and containing 1 wt ppm or less of each of as impurities Al, Fe, and Cu. The present invention also provides the high-purity yttrium and the high-purity yttrium sputtering target according to the above, wherein the total amount of W, Mo, and Ta is 10 wt ppm or less; the amount of each of U and Th is 50 wt ppb or less; and the amount of carbon is 150 wt ppm or less. The invention also provides high-purity yttrium and a high-purity yttrium sputtering target each having a purity, excluding rare earth elements and gas components, of 5N or more and containing 10 wt ppm or less of the total amount of Al, Fe, Cu, W, Mo, Ta, U, and Th. In the high-purity yttrium and the high-purity yttrium sputtering target, the radiation dose ($\alpha$-ray dose) is less than 0.001 cph/cm$^2$.

Regarding the production of the high-purity yttrium and the high-purity yttrium target, the invention can provide a method of producing high-purity yttrium by molten salt electrolysis of a raw material being a crude yttrium oxide having a purity, excluding gas components, of 4N or less at a bath temperature of 500° C. to 800° C. to obtain yttrium crystals; desalting treatment, water washing, and drying of the yttrium crystals; and electron beam melting for removing volatile materials.

As a molten salt electrolytic bath, potassium chloride (KCl), lithium chloride (LiCl), and yttrium chloride (YCl$_3$) are used. In the molten salt electrolysis, an anode made of Ta or stainless steel (SUS) can be used. The desalting treatment can be effectively performed by separating the metal and the salt from each other: by means of a vapor pressure differential by vacuum heating in a heating furnace at a temperature of 1000° C. or less; or by dissolving the salt with an acid.

As described above, it is possible to obtain high-purity yttrium and a high-purity yttrium sputtering target each having a purity, excluding rare earth elements and gas components, of 5N (99.999 wt %) or more, wherein each amount of aluminum (Al), iron (Fe), and copper (Cu) is 1 wt ppm or less, the total amount of W, Mo, and Ta is 10 wt ppm or less, each amount of U and Th is 50 wt ppb or less, and the amount of carbon is 150 wt ppm or less.

In order to produce the high-purity yttrium having a purity, excluding rare earth elements and gas components, of 5N or more, the steps and manufacturing conditions in each step are important. The object of the present invention cannot be achieved under conditions departing from such conditions.

The high-purity yttrium prepared by the method described above is a novel material and is encompassed in the present invention. In a case of using yttrium for the gate insulating film of an MOSFET, a YOx film is usually formed. In formation of such a film, an yttrium metal having high purity is necessary for increasing the degree of freedom in film formation to form an arbitrary film. The present invention can provide a material satisfying this.

The rare earth elements contained in yttrium include, other than yttrium (Y), La, Sc, Y, Ce, Pr, Nd, Pm, Sm, Eu, Gd, Tb, Dy, Ho, Er, Tm, Yb, and Lu. These elements have similar characteristics to those of Y, and it is therefore difficult to isolate and purify Y from these elements.

However, since these rare earth elements have approximate properties, these rare earth elements do not particularly cause a problem in use of yttrium as an electronic part material as long as the total amount of these rare earth elements is less than 100 wt ppm. Accordingly, the yttrium of the present invention may contain the rare earth elements within the range above.

In general, gas components are C, N, O, S, and H. Each of these elements may be present as a single element or may be present in a form of a compound (e.g., CO, $CO_2$, or $SO_2$) or a compound with a constituent element. Since these gas component elements have low atomic weights and small atomic radii, even if these elements are present as impurities of a material, these gas component elements hardly affect the characteristics of the material as long as the amount is not high. Accordingly, purities are generally shown as those excluding gas components. In this sense, the purity of yttrium of the present invention is 5N or more as a purity excluding gas components.

As described above, the present invention provides high-purity yttrium wherein the total amount of W, Mo, and Ta is 10 wt ppm or less; the amount of each of U and Th is 50 wt ppb or less; and the amount of carbon is 150 wt ppm or less. Furthermore, contents of aluminum (Al), iron (Fe), and copper (Cu) as well as contents of W, Mo, Ta, U and Th are preferably limited such that the high-purity yttrium of the present invention contains these metal elements as impurities in a total amount of 10 wt ppm or less. Since these elements are impurities in the high-purity yttrium that deteriorate semiconductor characteristics, it is desirable to reduce the amounts of these elements to an amount as small as possible.

The present invention can provide a sputtering target produced using the high-purity yttrium, a metal gate film formed using the sputtering target, and a semiconductor element and a device each comprising the metal gate film.

In a case of using yttrium for the gate insulating film of an MOSFET, as described above, a YOx film is usually formed. In formation of such a film, an yttrium metal having high purity is necessary for increasing the degree of freedom in film formation to form an arbitrary film. The present invention can provide a material satisfying this. Accordingly, the present invention encompasses an appropriate combination of the high-purity yttrium with another material in production of a target.

The high-purity yttrium prepared above is molten in vacuum and is then solidified into an ingot. This ingot is further cut into a predetermined size and polished to give high-purity yttrium or a high-purity yttrium sputtering target.

As a result, high-purity yttrium and a high-purity yttrium sputtering target each having a purity, excluding rare earth elements and gas components, of 5N or more and containing 1 wt ppm or less of each of Al, Fe, and Cu can be produced.

Furthermore, the radiation doses (α-ray doses) of the high-purity yttrium and the high-purity yttrium sputtering target of the present invention can each achieve less than 0.001 cph/cm$^2$.

Furthermore, sputtering of the target can give a metal gate film having a purity reflecting that of the target and having the same components as that of the target. The sputtering target, the metal gate film, and a semiconductor element and a device each comprising the film are all novel matters and are encompassed in the present invention.

The present invention has an excellent effect capable of stably providing high-purity yttrium, a sputtering target produced using the high-purity yttrium, a metal gate film formed using the sputtering target, and a semiconductor element and a device each comprising the metal gate film.

BRIEF DESCRIPTION OF DRAWINGS

FIG. 1 This is a diagram illustrating an example of the molten salt electrolysis apparatus.

FIG. 2 This is a photograph showing an electrolytic deposit after molten salt electrolysis shown in Example 1.

DETAILED DESCRIPTION

The present invention can use a crude yttrium oxide having a purity, excluding gas components, of 4N or less as the yttrium raw material to be highly purified.

Main impurities contained in such a material are, for example, Li, Na, K, Ca, Mg, Al, Si, Ti, Fe, Cr, Ni, Mn, Mo, Ce, Pr, Nd, Sm, Ta, W, and gas components (e.g., N, O, C, and H).

Aluminum (Al) and copper (Cu), which are contained in yttrium materials, are widely used as alloy materials for substrates, sources, drains, and other components of semiconductors and cause malfunction if they are contained in a gate material even if it in a small amount. Iron (Fe), which is contained in yttrium materials, is apt to be oxidized and causes sputtering failures when a target includes iron. Furthermore, even if iron is not oxidized in a target, oxidation after sputtering causes an increase in volume, which tends to cause defects such as insulation failure. Therefore, iron is particularly troublesome because of causing operation failure and is required to be reduced.

Raw materials contain large amounts of Fe and Al. Contamination with Cu often occurs from water-cooling members that are used in production of crude metals from chloride or fluoride by reduction. These impurity elements are present in forms of oxides in many yttrium raw materials.

The yttrium raw materials are usually prepared by calcium reduction of yttrium fluoride or yttrium oxide, and the reducing agent composed of calcium contains Fe, Al, and Cu as impurities. Consequently, impurity incorporation from the calcium reducing agent into the yttrium raw materials often occurs.

(Molten Salt Electrolysis)

In the present invention, in order to increase the purity of yttrium to achieve a purity of 5N or more, molten salt electrolysis is performed. FIG. 1 shows an example of a molten salt electrolysis apparatus. As shown in FIG. 1, an anode made of Ta or ferritic stainless steel (SUS) is disposed at the lower part of the apparatus. Austenitic stainless steel containing Ni causes contamination with Ni and is therefore improper.

Ta is used as a cathode. The portions that come into contact with electrolytic bath/electrolytic deposit are all desirably made of Ta or ferritic stainless steel (SUS) for preventing contamination.

In particular, SUS is inexpensive and is therefore more preferred. Other metals such as Ti and Ni that are used in molten salt electrolysis are apt to form alloys with Y and are therefore improper. Graphite is usually used in molten salt electrolysis of rare earth elements, but graphite causes contamination with carbon. Accordingly, use of graphite must be avoided in the present invention. In molten salt electrolysis, a crucible made of Ta or ferritic stainless steel (SUS) is used for avoiding contamination.

A basket for separating the Y raw material from the electrolytic deposit is disposed at the central lower part. The upper half is a cooling tower. This cooling tower is partitioned from the electrolytic bath with a gate valve (GV).

The composition of a bath can be prepared by selecting one or more from potassium chloride (KCl), lithium chloride (LiCl), sodium chloride (NaCl), magnesium chloride (MgCl$_2$), and calcium chloride (CaCl$_2$) and mixing the selected chloride(s) with yttrium chloride (YCl$_3$). Another Y raw material can also be used. The ratio of these materials is appropriately adjusted.

The yttrium raw material is desirably controlled to be 20% to 30% based on the total weight of the salts. By doing so, efficient molten salt electrolysis is possible. The ratio of a salt is preferably determined as a point on a phase diagram at which a minimum melting point occurs.

The temperature of the electrolytic bath is preferably adjusted to be within a range of 500° C. to 800° C. The bath temperature does not highly affect electrolysis, but a temperature higher than this range causes strong volatilization of the salt constituting the bath to contaminate the gate valve and the cooling tower. Such a high temperature therefore makes cleaning thereof complicated and therefore should be avoided.

A lower temperature makes handling easy. However, a temperature of lower than the range decreases the fluidity of the bath to generate distribution in the composition of the bath. As a result, normal electrodeposition tends not to be achieved. The above-mentioned temperature range is therefore preferred.

The atmosphere is an inert atmosphere. Electrolysis is generally carried out under an Ar gas flow. The anode is preferably made of a material that does not cause contamination. In such a sense, use of Ta or stainless steel (SUS) is desirable. The cathode is made of Ta. Though graphite is usually used in molten salt electrolysis of rare earth elements, graphite causes contamination with carbon. Accordingly, use of graphite must be avoided in the present invention.

(Electrolysis Condition)

The current density can be appropriately determined within a range of 0.5 to 2.0 A/cm$^2$. The voltage is about 0.5 to 1.0 V. These conditions are, however, changed depending on the scale of the apparatus, and other conditions are also acceptable. The electrolysis is usually carried out for about 4 to 24 h. The weight of resultant electrolytic deposit is about 300 to 1000 g when the above-described molten salt electrolysis apparatus is used.

(Heating Furnace)

The metal and the salt are separated from each other by means of a vapor pressure differential by vacuum heating in a heating furnace. The temperature for desalting is usually 1000° C. or less. The retention time is 10 to 200 h and may be appropriately controlled based on the amount of raw materials. The weight of electrolytic deposit Y is decreased by about 5% to 35% by the desalting.

That is, it is demonstrated that desalting decreases the amount of Cl by about 5% to 35%. The content of chlorine (Cl) contained in the Y material after desalting treatment is 50 to 3000 wt ppm.

(Induction Melting)

The resulting yttrium is subjected to induction melting in a vacuum atmosphere using a water-cooled Cu crucible and is solidified into an ingot. Though a water-cooled Cu crucible is used in this embodiment, a carbon crucible can also be used depending on the melting apparatus. In this induction melting, the amounts of Mg and Ca, which are difficult to be removed by the molten salt electrolysis, can be removed.

(Electron Beam Melting)

Electron beam melting of the resulting yttrium is performed by extensively irradiating the molten yttrium raw material in the furnace with low-output electron beams, usually, at 20 to 50 kW. This electron beam melting can be repeated several times (2 to 4 times). An increase in the frequency of the electron beam melting enhances the removal of volatile components such as Cl, Ca, and Mg.

The induction melting and the electron beam melting may be performed both or either one. In a case of performing both melting processes, the order thereof is not particularly limited. The crucible used for melting may be made of any material, and a water-cooled crucible is usually used.

In the above, rare earth elements are excluded from impurities related to the purity of high-purity yttrium. The reasons of this are as follows: since rare earth elements other than yttrium have chemical characteristics similar to those of yttrium, it is technically very difficult to remove such elements in production of high-purity yttrium, and also due to this similarity of the characteristics, contamination with these elements as impurities does not cause a large modification of the characteristics.

Because of such circumstances, contamination with rare earth elements other than yttrium is acceptable to some degree, but lower amounts of the rare earth elements are desirable for enhancing the characteristics of yttrium itself.

The purity, excluding gas components, is 5N or more. The reasons for excluding gas components from impurities are as follows: it is difficult to remove gas components, and the amount of gas components does not become a measure of improvement in purity. In general, presence of a small amount of gas components is harmless compared to other impurity elements, in most cases.

A thin film of an electronic material, such as a gate insulating film or a metal-gate thin film, is formed by sputtering in most cases, and sputtering is an excellent method for forming thin films. Accordingly, it is effective to produce a high-purity yttrium sputtering target using the yttrium ingot.

The target can be produced by ordinary processes such as forging, rolling, cutting (machining), and finishing (polishing). The production process is not particularly limited and may be appropriately selected.

As described above, high-purity yttrium having a purity, excluding gas components, of 5N or more and containing 1 wt ppm or less of each of Al, Fe, and Cu, 10 wt ppm or less of the total amount of W, Mo, and Ta, 50 wt ppb or less of each of U and Th, and 150 wt ppm or less of carbon can be obtained.

A target is produced by cutting the high-purity yttrium ingot into a predetermined size and then subjecting the cut ingot to cutting (machining) and polishing.

Furthermore, a film of the high-purity yttrium can be formed on a substrate by sputtering the high-purity yttrium target. As a result, a metal gate film of which main component is high-purity yttrium having a purity, excluding rare earth elements and gas components, of 5N or more and containing 1 wt ppm or less of each of Al, Fe, and Cu can be produced on a substrate. The film on the substrate has a composition reflecting that of the target and is therefore an yttrium film having high purity.

In use as a metal gate film, the film may be formed so as to have the composition of the high-purity yttrium itself or may be formed as a film made of a mixture, alloy, or compound of the high-purity yttrium and another gate material. Such a film can be formed by simultaneously sputtering the high-purity yttrium and another gate material target or by sputtering using a mosaic target. These cases are encompassed in the present invention. Though the contents of impurities vary depending on the amounts of impurities contained in a raw material, the amounts of impurities can be controlled within the ranges mentioned above by employing the above-mentioned method.

The present invention provides a technology capable of efficiently and stably providing high-purity yttrium prepared as in above, a sputtering target made of high-purity yttrium, and a metal-gate thin film of which main component is high-purity yttrium.

In particular, the sputtering target made of the high-purity yttrium of the present invention has satisfactory characteristics, causes less occurrence of arcing, and has a satisfactory target life (long and stable), and it is therefore significantly effective for forming a circuit for an advanced semiconductor.

Furthermore, in the high-purity yttrium sputtering target produced by the present invention, a radiation dose (α-ray dose) lower than 0.001 cph/cm$^2$ can be achieved. This means that the sensitivity is one digit or more higher than that, 0.04 cph/cm$^2$, of conventional products (commercial products) and is one of notability of the yttrium sputtering target of the present invention.

EXAMPLES

Examples will now be described. The examples are intended to facilitate understanding and do not limit the present invention. That is, other examples and modifications within the technical idea of the present invention are included in the present invention.

Example 1

As an yttrium raw material to be treated, a commercial product having a purity of 2N to 3N was used. The analytical values of this yttrium raw material are shown in Table 1.

TABLE 1

| Commercial product Y (2N to 3N) | | Commercial product Y (2N to 3N) | |
|---|---|---|---|
| Element | wt ppm | Element | wt ppm |
| Li | <0.01 | Pd | <0.5 |
| Be | 0.03 | Ag | <1 |
| B | 0.41 | Cd | <0.5 |
| C | 350 | In | <0.1 |
| N | 52 | Sn | 0.22 |
| O | 4200 | Sb | 0.26 |
| F | 22 | Te | <0.1 |
| Na | <0.05 | I | <0.5 |
| Mg | 24 | Cs | <0.1 |
| Al | 440 | Ba | <0.01 |
| Si | 600 | La | 17 |
| P | 1.2 | Ce | 1.3 |
| S | 16 | Pr | 11 |
| Cl | 0.54 | Nd | 43 |
| K | <0.1 | Sm | 2.1 |
| Ca | 1800 | Eu | <0.01 |
| Sc | <0.05 | Gd | 1.5 |
| Ti | 21 | Tb | 0.86 |
| V | 0.18 | Dy | 8.9 |
| Cr | 52 | Ho | 21 |
| Mn | 21 | Er | 22 |
| Fe | 240 | Tm | 0.28 |
| Co | 0.13 | Yb | <0.01 |
| Ni | 370 | Lu | 0.25 |
| Cu | 340 | Hf | <0.05 |
| Zn | <0.5 | Ta | 30 |
| Ga | 0.19 | W | 730 |
| Ge | <0.1 | Re | <0.01 |
| As | <0.1 | Os | <0.01 |
| Se | <0.5 | Ir | <0.01 |
| Br | <0.5 | Pt | <0.05 |
| Rb | <0.05 | Au | <0.5 |
| Sr | <0.05 | Hg | <0.1 |
| Y | — | Ti | <0.01 |
| Zr | 0.7 | Pb | 1.1 |
| Nb | 0.09 | Bi | <0.01 |
| Mo | 8.7 | Th | 0.05 |
| Ru | <0.1 | U | 0.03 |
| Rh | <1 | | |

(Molten Salt Electrolysis)

This raw material was subjected to molten salt electrolysis. The molten salt electrolysis was performed with the apparatus shown in FIG. 1. The composition of the bath was 20 kg of potassium chloride (KCl), 12 kg of lithium chloride (LiCl), and 4 kg of yttrium chloride (YCl$_3$), and 6 kg of the Y raw material was used.

The temperature of the electrolytic bath was controlled within 500° C. to 800° C. and was 600° C. in this Example. The temperature of the bath did not highly affect electrolysis. At this temperature, the volatilization of the salt was low, and the gate valve and the cooling tower were not severely polluted.

The electrolysis was performed at a current density of 1.0 A/cm$^2$ and a voltage of 1.0 V for 12 h. As a result, 500 g of an electrolytic deposit was obtained. The shape of the resulting crystals is shown in FIG. 2.

Table 2 shows the analytical results of the deposit obtained by the electrolysis. As shown in Table 2, as expected results of molten salt electrolysis, though the concentrations of chlorine and potassium were significantly high and the amounts of Mg and Ca, which are alkali earth metals having properties similar to those of rare earth elements, were not sufficiently reduced, the amounts of other impurities were reduced.

TABLE 2

| Electrolytic deposit | | Electrolytic deposit | |
|---|---|---|---|
| Element | wt ppm | Element | wt ppm |
| Li | 11 | Pd | <0.5 |
| Be | <0.01 | Ag | <1 |
| B | <0.01 | Cd | <0.5 |
| C | 150 | In | <0.1 |
| N | 17 | Sn | <0.1 |
| O | 4000 | Sb | <0.1 |
| F | 3.2 | Te | <0.1 |
| Na | <0.05 | I | <0.5 |
| Mg | 10 | Cs | <0.1 |
| Al | 0.19 | Ba | <0.01 |
| Si | 0.1 | La | 28 |
| P | <0.05 | Ce | 4.4 |
| S | 2 | Pr | 24 |
| Cl | 71 | Nd | 36 |
| K | 120 | Sm | 0.04 |
| Ca | 0.12 | Eu | <0.01 |
| Sc | <0.05 | Gd | 5.9 |
| Ti | 0.02 | Tb | 6.7 |
| V | <0.01 | Dy | 7.7 |
| Cr | 0.21 | Ho | 28 |
| Mn | 0.05 | Er | 35 |
| Fe | 0.47 | Tm | 0.2 |
| Co | <0.01 | Yb | 0.01 |
| Ni | 0.13 | Lu | 0.16 |
| Cu | <0.05 | Hf | 0.28 |
| Zn | <0.5 | Ta | <5 |
| Ga | <0.1 | W | <0.05 |
| Ge | <0.1 | Re | <0.01 |
| As | <0.1 | Os | <0.01 |
| Se | <0.5 | Ir | <0.01 |
| Br | <0.5 | Pt | <0.05 |
| Rb | <0.05 | Au | <0.5 |
| Sr | <0.05 | Hg | <0.1 |
| Y | — | Ti | <0.01 |
| Zr | <0.1 | Pb | <0.05 |
| Nb | <0.05 | Bi | <0.01 |
| Mo | <0.1 | Th | <0.005 |
| Ru | <0.1 | U | <0.005 |
| Rh | <1 | | |

(Desalting Treatment)

The electrolytic deposit was vacuum-heated using a heating furnace to separate the metal and the salt from each other by means of a vapor pressure differential. The desalting was performed at a temperature of 850° C. and a retention time of 100 h. The weight of electrolytic deposit Y was decreased by about 20% by the desalting. The content of chlorine (Cl) contained in the Y material after desalting treatment was reduced to 160 wt ppm.

(Electron Beam Melting)

The yttrium obtained in the above was subjected to electron beam (EB) melting. The electron beam melting was performed by extensively irradiating the molten yttrium raw material in the furnace with low-output electron beams: a degree of vacuum of $6.0 \times 10^{-5}$ to $7.0 \times 10^{-4}$ mbar and a melting output of 30 kW. The electron beam melting was repeated twice for 30 min each.

As a result, an EB molten ingot was obtained. During the EB melting, highly volatile materials were removed by volatilization and volatile components such as Cl could be removed.

Thus, high-purity yttrium could be produced. Table 3 shows the analytical values of the high-purity yttrium. As shown in Table 3, the yttrium contained 0.18 wt ppm of Al, 0.77 wt ppm of Fe, and 0.16 wt ppm of Cu. The results demonstrate that the contents of these elements achieved the requirements of the present invention, i.e., a content of 1 wt ppm or less.

TABLE 3

| High-purity yttrium | | High-purity yttrium | |
|---|---|---|---|
| Element | wt ppm | Element | wt ppm |
| Li | <0.01 | Pd | <0.5 |
| Be | <0.01 | Ag | <1 |
| B | <0.01 | Cd | <0.5 |
| C | 130 | In | <0.1 |
| N | 11 | Sn | <0.1 |
| O | 4200 | Sb | <0.1 |
| F | <0.5 | Te | <0.1 |
| Na | <0.05 | I | <0.5 |
| Mg | <0.05 | Cs | <0.1 |
| Al | 0.18 | Ba | <0.01 |
| Si | 0.1 | La | 17 |
| P | <0.05 | Ce | 2.8 |
| S | 2.8 | Pr | 10 |
| Cl | 0.76 | Nd | 21 |
| K | <0.1 | Sm | <0.01 |
| Ca | <0.1 | Eu | <0.01 |
| Sc | <0.05 | Gd | 3.3 |
| Ti | 0.15 | Tb | 2.9 |
| V | <0.01 | Dy | 3.4 |
| Cr | 0.14 | Ho | 20 |
| Mn | <0.01 | Er | 30 |
| Fe | 0.77 | Tm | <0.01 |
| Co | <0.01 | Yb | <0.01 |
| Ni | 0.3 | Lu | 0.13 |
| Cu | 0.16 | Hf | <0.05 |
| Zn | <0.5 | Ta | <5 |
| Ga | <0.1 | W | <0.05 |
| Ge | <0.1 | Re | <0.01 |
| As | <0.1 | Os | <0.01 |
| Se | <0.5 | Ir | <0.01 |
| Br | <0.5 | Pt | <0.05 |
| Rb | <0.05 | Au | <0.5 |
| Sr | <0.05 | Hg | <0.1 |
| Y | — | Tl | <0.01 |
| Zr | <0.1 | Pb | <0.05 |
| Nb | <0.05 | Bi | <0.01 |
| Mo | <0.1 | Th | <0.005 |
| Ru | <0.1 | U | <0.005 |
| Rh | <1 | | |

Analytical values of main impurities were as follows: Li: <0.01 wt ppm, Na: <0.05 wt ppm, K: <0.1 wt ppm, Ca: <0.1 wt ppm, Mg: <0.05 wt ppm, Si: 0.1 wt ppm, Ti: 0.15 wt ppm, Ni: 0.3 wt ppm, Mn: <0.01 wt ppm, Mo: <0.1 wt ppm, Ta: <5 wt ppm, W: <0.05 wt ppm, U: <0.005 wt ppm, and Th: <0.005 wt ppm. In addition, preferred requirements of the present invention, i.e., the total amount of W, Mo, and Ta being 10 wt ppm or less and the amount of carbon being 150 wt ppm or less, were also all achieved.

Furthermore, the radiation dose (α-ray dose) of the target of this Example was less than 0.001 cph/cm².

The thus-obtained yttrium ingot was optionally hot-pressed and was further subjected to machining and polishing to give a disk-shaped target of φ140×14t. The target had a weight of 0.96 kg. The target was bonded to a backing plate to give a sputtering target. As a result, a high-purity yttrium sputtering target having the composition mentioned above was prepared. Since this target is apt to be oxidized, it is preferable to store or carry the target in a vacuum packed state.

Comparative Example 1

As an yttrium raw material to be treated, a commercial product having a purity of 2N to 3N was used. The yttrium raw material used in this case had the same purity as that in Example 1 shown in Table 1. The commercially available yttrium used in Comparative Example 1 had a plate shape of 120-mm square with 30-mm thickness. The weight of one plate was 1.5 to 2.0 kg, and 12 plates of 17 kg in total were used as the raw material. Since this tabular yttrium raw material was very readily oxidized, the material was vacuum packed with aluminum.

The yttrium was molten in an EB furnace at a melting output of 32 kW, and an ingot was produced at a casting speed of 8.0 kg/h. During the EB melting, highly volatile materials were removed by volatilization. As a result, 16.74 kg of a high-purity yttrium ingot was produced. Table 4 shows the analytical values of the thus-obtained high-purity yttrium.

As shown in Table 4, the yttrium contained 600 wt ppm of Al, 290 wt ppm of Fe, and 480 wt ppm of Cu. The contents of these elements did not achieve the requirements of the present invention, i.e., a content of 1 wt ppm or less. Thus, the purpose of the present invention could not be achieved merely by subjecting commercially available Y to EB melting.

The radiation dose (α-ray dose) of the target of this Comparative Example was 0.04 cph/cm², which was equivalent to that of commercial products. It is believed that the high radiation dose was caused by the yttrium material contained a large amount of impurities and that the radiation dose increased in association with the amount of impurities.

TABLE 4

| Commercial product Y (2N to 3N) | | Commercial product Y (2N to 3N) | | Y after EB melting | | Y after EB melting | |
|---|---|---|---|---|---|---|---|
| Element | wt ppm | Element | wt ppm | Element | wt ppm | Element | wt ppm |
| Li | <0.01 | Pd | <0.5 | Li | <0.01 | Pd | <0.5 |
| Be | 0.03 | Ag | <1 | Be | 0.02 | Ag | <1 |
| B | 0.41 | Cd | <0.5 | B | 0.55 | Cd | <0.5 |
| C | 350 | In | <0.1 | C | ~3500 | In | <0.1 |
| N | 52 | Sn | 0.22 | N | 15 | Sn | 0.24 |
| O | 4200 | Sb | 0.26 | O | ~6000 | Sb | 0.26 |
| F | 22 | Te | <0.1 | F | 18 | Te | <0.1 |
| Na | <0.05 | I | <0.5 | Na | <0.05 | I | <0.5 |
| Mg | 24 | Cs | <0.1 | Mg | <0.05 | Cs | <0.1 |
| Al | 440 | Ba | <0.01 | Al | 600 | Ba | <0.01 |
| Si | 600 | La | 17 | Si | 340 | La | 35 |
| P | 1.2 | Ce | 1.3 | P | 1.1 | Ce | 3.5 |
| S | 16 | Pr | 11 | S | 18 | Pr | 15 |

TABLE 4-continued

| Commercial product Y (2N to 3N) | | Commercial product Y (2N to 3N) | | Y after EB melting | | Y after EB melting | |
|---|---|---|---|---|---|---|---|
| Element | wt ppm | Element | wt ppm | Element | wt ppm | Element | wt ppm |
| Cl | 0.54 | Nd | 43 | Cl | 0.74 | Nd | 48 |
| K | <0.1 | Sm | 2.1 | K | <0.1 | Sm | 0.04 |
| Ca | 1800 | Eu | <0.01 | Ca | 50 | Eu | <0.01 |
| Sc | <0.05 | Gd | 1.5 | Sc | <0.05 | Gd | 4.2 |
| Ti | 21 | Tb | 0.86 | Ti | 33 | Tb | 5.5 |
| V | 0.18 | Dy | 8.9 | V | 0.17 | Dy | <0.01 |
| Cr | 52 | Ho | 210 | Cr | 48 | Ho | 20 |
| Mn | 21 | Er | 22 | Mn | 11 | Er | <0.01 |
| Fe | 240 | Tm | 0.28 | Fe | 290 | Tm | <0.01 |
| Co | 0.13 | Yb | <0.01 | Co | 0.44 | Yb | <0.01 |
| Ni | 370 | Lu | 0.25 | Ni | 410 | Lu | 0.13 |
| Cu | 340 | Hf | <0.05 | Cu | 480 | Hf | <0.05 |
| Zn | <0.5 | Ta | =<3 | Zn | <0.5 | Ta | 33 |
| Ga | 0.19 | W | 730 | Ga | <0.1 | W | 470 |
| Ge | <0.1 | Re | <0.01 | Ge | <0.1 | Re | <0.01 |
| As | <0.1 | Os | <0.01 | As | <0.1 | Os | <0.01 |
| Se | <0.5 | Ir | <0.01 | Se | <0.5 | Ir | <0.01 |
| Br | <0.5 | Pt | <0.05 | Br | <0.5 | Pt | <0.05 |
| Rb | <0.05 | Au | <0.5 | Rb | <0.05 | Au | <0.5 |
| Sr | <0.05 | Hg | <0.1 | Sr | <0.05 | Hg | <0.1 |
| Y | — | Ti | <0.01 | Y | — | Ti | <0.01 |
| Zr | 0.7 | Pb | 1.1 | Zr | <0.1 | Pb | <0.05 |
| Nb | 0.09 | Bi | <0.01 | Nb | 0.06 | Bi | <0.01 |
| Mo | 8.7 | Th | 0.05 | Mo | 8.1 | Th | 0.05 |
| Ru | <0.1 | U | 0.03 | Ru | <0.1 | U | 0.04 |
| Rh | <1 | | | Rh | <1 | | |

Analytical values of main impurities were as follows: Li: 0.01 wt ppm, Na: <0.05 wt ppm, K: <0.1 wt ppm, Ca: 50 wt ppm, Mg: <0.05 wt ppm, Si: 340 wt ppm, Ti: 33 wt ppm, Cr: 48 wt ppm, Ni: 410 wt ppm, Mn: 11 wt ppm, Mo: 8.1 wt ppm, Ta: 33 wt ppm, W: 470 wt ppm, U: 0.04 wt ppm, and Th: 0.05 wt ppm.

As obvious from the comparison between the Example and the Comparative Example, an yttrium raw material purified merely by electron beam melting still contains a large amount of impurities and cannot achieve the purpose of the present invention.

As shown in the Example, a purity, excluding rare earth elements and gas components, of 5N or more can be achieved by subjecting a crude yttrium oxide having a purity, excluding gas components, of 4N or less to molten salt electrolysis to obtain yttrium crystals; subjecting the yttrium crystals to desalting treatment, water washing, and drying; and then removing volatile materials by electron beam melting.

The high-purity yttrium prepared by the present invention, the sputtering target produced from the high-purity yttrium, and the metal-gate thin film mainly made of the high-purity yttrium do not reduce or disturb the function of electronic equipment as electronic materials disposed near, in particular, silicon substrates and therefore are useful as materials of, for example, a gate insulating film or a metal-gate thin film.

The invention claimed is:

1. A high-purity yttrium in a form of a cast ingot having a purity of 5N or higher excluding rare earth elements and gas components and containing as impurities Al, Fe, and Cu each in an amount of 1 wt ppm or less, U and Th each in an amount of 50 wt ppb or less, Al, Fe, Cu, W, Mo, Ta, U, and Th in a total amount of 10 wt ppm or less, Mg in an amount less than 0.05 wt ppm, Ca in an amount of less than 0.1 wt ppm, and carbon in an amount of 150 wt ppm or less.

2. The high-purity yttrium according to claim 1, having a radiation dose or α-ray dose in an amount of less than 0.001 cph/cm$^2$.

3. The high-purity yttrium according to claim 1, wherein the target contains an amount of carbon.

4. The high-purity yttrium according to claim 3, wherein the target contains 130 wtppm of carbon.

5. The high-purity yttrium according to claim 3, wherein the target contains an amount of aluminum.

6. The high-purity yttrium according to claim 5, wherein the target contains 0.18 wtppm of aluminum.

7. A method of producing a high-purity yttrium in a form of a cast ingot, the method comprising:
molten salt electrolysis of a raw material being a crude yttrium oxide having a purity, excluding gas components, of 4N or less at a bath temperature of 500° C. to 800° C. to obtain yttrium crystals;
desalting treatment, water washing, and drying of the yttrium crystals; and
electron beam melting for removing volatile materials to achieve a purity, excluding rare earth elements and gas components, of 5N or more and containing 1 wt ppm or less of each of Al, Fe, and Cu, 50 wt ppb or less of each of U and Th, 10 wt ppm or less in total of Al, Fe, Cu, W, Mo, Ta, U, and Th, less than 0.05 wt ppm of Mg, less than 0.1 wt ppm of Ca, and 150 wt ppm or less of carbon.

8. The method of producing high-purity yttrium according to claim 7, wherein an electrolytic bath composed of potassium chloride (KCl), lithium chloride (LiCl), and yttrium chloride (YCl$_3$) is used as a molten salt electrolytic bath.

9. The method of producing high-purity yttrium according to claim 8, wherein the molten salt electrolysis is performed using an anode made of Ta or ferritic stainless steel (SUS).

10. The method of producing high-purity yttrium according to claim 9, wherein the desalting treatment is performed by separating a metal and a salt from each other by means of a vapor pressure differential by vacuum heating in a heating furnace at a temperature of 1000° C. or less, or by dissolving a salt with an acid.

11. The method of producing high-purity yttrium according to claim 7, wherein the molten salt electrolysis is performed using an anode made of Ta or ferritic stainless steel (SUS).

12. The method of producing high-purity yttrium according to claim 7, wherein the desalting treatment is performed by separating a metal and a salt from each other by means of a vapor pressure differential by vacuum heating in a heating furnace at a temperature of 1000° C. or less, or by dissolving a salt with an acid.

13. A high-purity yttrium sputtering target formed form a cast ingot having a purity of 5N or higher excluding rare earth elements and gas components and containing as impurities Al, Fe, and Cu each in an amount of 1 wt ppm or less, U and Th each in an amount of 50 wt ppb or less, Al, Fe, Cu, W, Mo, Ta, U, and Th in a total amount of 10 wt ppm or less, Mg in an amount less than 0.05 wt ppm, Ca in an amount of less than 0.1 wt ppm, and carbon in an amount of 150 wt ppm or less.

14. The high-purity yttrium sputtering target according to claim 13, having a radiation dose or α-ray dose in an amount of less than 0.001 cph/cm$^2$.

15. A metal gate film formed using the high-purity yttrium sputtering target according to claim 13.

16. A semiconductor element and a device each comprising the metal gate film according to claim 15.

17. The high-purity yttrium sputtering target according to claim 13, wherein the target contains an amount of carbon.

18. The high-purity yttrium sputtering target according to claim 17, wherein the target contains 130 wtppm of carbon.

19. The high-purity yttrium sputtering target according to claim 17, wherein the target contains an amount of aluminum.

20. The high-purity yttrium sputtering target according to claim 19, wherein the target contains 0.18 wtppm of aluminum.

* * * * *